(12) United States Patent
Goutti

(10) Patent No.: US 6,407,636 B1
(45) Date of Patent: Jun. 18, 2002

(54) STABILITY CONTROL MULTISTAGE OPERATIONAL AMPLIFIER

(75) Inventor: Frédéric Goutti, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/611,301

(22) Filed: Jul. 6, 2000

(30) Foreign Application Priority Data

Jul. 9, 1999 (FR) .............................................. 99 08931

(51) Int. Cl.[7] .................................................. H03F 1/14
(52) U.S. Cl. ........................ 330/255; 330/292; 330/311
(58) Field of Search ................................. 330/255, 292, 330/311, 98, 99, 100

(56) References Cited

U.S. PATENT DOCUMENTS 4,405,900 A * 9/1983 Van de Plassche ..... 330/255 X
4,502,017 A * 2/1985 Van de Plassche et al. ....................... 330/292 X

* cited by examiner

*Primary Examiner*—Steven J. Mottola
(74) *Attorney, Agent, or Firm*—Lisa K. Jorgenson; Allen, Dyer, Doppelt, Milbrath & Gilchrist, P.A.

(57) ABSTRACT

An operational amplifier includes an input transconductor stage with differential inputs and an output, an output stage, and at least one intermediate stage connected between the input stage and the output stage so as to form an amplifier chain. The intermediate stage includes a common-emitter bipolar transistor between first and second power supply terminals, and at least one feedback resistor connected between the bipolar transistor emitter and one of the power supply terminals. The intermediate stage also includes at least one feedback capacitance connected between the emitter terminal of the transistor and an output of a next stage.

25 Claims, 2 Drawing Sheets

STABILITY CONTROL MULTISTAGE OPERATIONAL AMPLIFIER

FIELD OF THE INVENTION

The present invention relates to electronics, and, more particularly, to a multistage operational amplifier capable of operating at a low power supply voltage.

For an operational amplifier, a low supply voltage corresponds to a voltage of about 1.8 volts. This voltage corresponds to the voltage of two series-connected electric cells or batteries having a rated voltage of 1.5 volts in a discharged state. In the discharged state, the batteries each have a voltage of about 0.9 volts.

An amplifier capable of operating on a voltage greater than or equal to 1.8 volt thus allows the best possible use of the energy available in the devices being powered by batteries. However, the use of the amplifier is not limited to battery powered devices.

The amplifier can be applied to various types of electronic circuits and, in particular, circuits requiring a high current gain. Thus, the amplifier can be implemented in interface circuitry, power stages, adder circuits, and filters, etc. The amplifier can also be used in portable electric devices, such as headsets and mobile phones, regardless of whether these devices are battery powered.

BACKGROUND OF THE INVENTION

A basic diagram of a known type multistage operational amplifier is illustrated in FIG. 1. The amplifier of FIG. 1 includes an input transconductor stage marked as reference 10. Transconductor stage 10 includes a differential input with two input terminals 12+ and 12−, and one current output terminal 14. Input terminals 12+ and 12− respectively correspond to a non-inverting input and an inverting input. Output 14 is linked to a gain amplifier chain including in order, a first intermediate stage 20, a second intermediate stage 30, and an output stage 50. The stages are connected in parallel between power supply terminals 1 and 2.

The first and second intermediate stages and the output stage are respectively based on first, second, and third common-emitter bipolar transistors 22, 32, and 52. These transistors are respectively biased by current sources 24, 34, and 54. The bases and collectors of these transistors respectively form input and output terminals of the respective stages.

The base of the first bipolar transistor 22 is connected to the current output 14 of input stage 10, and its collector is connected to the base of the second transistor 32. Moreover, the collector of the second transistor 32 is connected to the base of the third transistor 52 of the output stage. The collector of the third transistor 52 is an amplifier output terminal, which is more precisely marked as reference 56. Output stage 50 is linked to an external load L, indicated as a dotted line. This load, which is not part of the amplifier, is considered to have an impedance with a capacitive portion having a value of C1.

Also apparent in FIG. 1 are a number of capacitors. A first capacitor 60, having a value of CM, is connected between the input of the first stage 20, i.e., the base of the first transistor 22, and the amplifier output terminal 56. A second capacitor 62, having a value of $CM_2$, is connected between the base and the collector of the first transistor 22, i.e., between the input and the output of the first intermediate stage 20. A third capacitor 63, having a value of $CM_3$, is connected between the base and the collector of the third transistor 52, i.e., between the input and the output of output stage 50.

Capacitors 60, 62, and 63 are frequency compensation capacitors providing the amplifier's closed loop stability. Such capacitors are usually called "Miller capacitances". Provisions can be made for further capacitors of the same kind. In general, frequency compensation capacitors are connected between the input of a given stage and the output of the stage, or the output of a next stage in the gain amplifier chain.

The terms next and previous are used in the course of the description to qualify a gain stage. These terms refer to a definite order within the amplifier chain, i.e., from the input stage to the output stage. This order corresponds to a signal path inside the amplifier. The Miller capacitances and external capacitors connected to the amplifier control the frequency behavior thereof and that of each of its stages.

This behavior is characterized by poles. The poles correspond to frequencies at which gain slope modifications are observed in a frequency response diagram, or Bode diagram. The Bode diagram expresses the amplifier gain as a function of the frequency of a signal passing through the amplifier.

In the example of FIG. 1, a first pole $p_1$ corresponding to output stage 50 and generated by the capacitive portion of the external load L connected to the amplifier output can be defined. The expression of the first pole $p_1$, the dimension of which is an angular frequency, is as follows:

$$P_1 = \frac{gm_3}{C1}$$

In this expression, C1 is the capacitive value of load L, and $gm_3$ is the transconductance of the third transistor 52, i.e., the output stage. The first pole corresponds to a frequency $f_1$, such as:

$$f_1 = \frac{P_1}{2\pi}$$

In the same way, a second pole corresponding to the second intermediate stage 30 can be defined. This pole is an intermediate pole and corresponds to an angular frequency $p_2$, the expression of which is more complex:

$$P_2 = \frac{CM}{CM_2} X \frac{gm_2}{CM_3}$$

CM, $CM_2$, $CM_3$ are the respective values of the first, second, and third capacitors, and $gm_2$ is the transconductance of the second transistor 32. The second pole corresponds to a frequency of:

$$f_2 = \frac{P_2}{2\pi}$$

Finally, a so-called unity gain frequency related to the first capacitor 60, having a value of CM, is defined which provides the amplifier's closed-loop stability. The expression of the amplifier's unity gain frequency, designated as $f_{gu}$, is:

$$f_{gu} = \frac{gm}{2\pi CM}.$$

In this expression, gm designates the transconductance of input stage 10. In order to provide amplifier stability, i.e., to avoid an interference oscillation phenomena, selection of the values CM, $CM_2$, and $CM_3$ is done so that the following equation of stability is true:

$$f_{gu} \leq k_2 f_2 \leq k_1 f_1$$

The variables $k_1$ and $k_2$ are multiplication factors, such as $k_2 > 1$ and $k_1 > 1$.

The equation above translates the fact that the pole frequencies respectively introduced by the successive stages from the amplifier input to the output must be increasing and distinct. This rule, which applies to the example of FIG. 1, is true for an amplifier having a different number of gain stages.

The values of the multiplication factors k and k', generally equal to 2, must be chosen to be greater than 1 to ensure that the poles will not be mixed up. A large value of these factors ensures good amplifier stability.

As specified above, the choice of Miller capacitances is dictated by the equation of stability. Capacitances are chosen in particular so that the equation of stability is true when an amplifier quiescent or rest current is passing through the gain stage transistors. This quiescent current corresponds to the current passing through the gain stage transistors when no signal is being applied at the amplifier input.

For a given stage including one or more bipolar transistors, the transconductance value is dependent on the collector current of the transistor(s). More precisely, the following is obtained for each intermediate stage:

$$gm_i = \frac{I_i}{V_T}$$

In this expression, $gm_i$ and $I_i$ respectively designate the transistor transconductance and collector current of the stage under consideration. The term $V_t$ is a thermal voltage defined by:

$$V_t = \frac{kT}{q}$$

where T is temperature, k the Boltzmann constant and q the electron charge. Thus, for the second intermediate stage, the collector current of which is written as $IC_2$:

$$gm_2 = \frac{IC_2}{V_t}$$

In the presence of an amplifier input signal, collector currents other than the quiescent currents are flowing through the transistor collectors. Thus, the pole frequency values, which are transconductance dependent, vary and tend to increase. This phenomenon is called pole frequency deviation.

Pole frequency deviation substantially depends on the transistor gains used and the amplifier's external operating conditions, which determine the collector currents in the stages. Pole frequency deviation does not have to be uniform for all stages, and the frequency of an intermediate stage pole can become greater than that of a next stage. The equation of stability is then no longer satisfied and a spurious amplifier oscillation occurs.

Another problem is the presence of further high frequency poles. Such poles are introduced by parasitic capacitors having low values, which are negligible at low frequency. Instability can then occur when a pole of a given stage, in its frequency deviation, should exceed a new pole related to the parasitic capacitors.

To avoid oscillations due to pole frequency deviation, the amplifier's current gain must be limited. Thus, changes of the currents flowing inside the transistor collectors can be reduced. Limiting the transistor collector currents reduces the increase in transconductance thereof, and consequently, as explained above, pole frequency deviation. However, current output limitation is a considerable constraint, in particular, for amplifiers designed to operate on a low supply voltage.

SUMMARY OF THE INVENTION

In view of the foregoing background, it is therefore an object of the present invention to provide an improved multistage operational amplifier that does not have the limitations discussed above. In particular, the amplifier is to be stable and have a high current gain, i.e., a high ratio between the maximum output current and the quiescent or rest current.

Another object of the present invention is to provide an amplifier capable of amplifying high frequency signals while avoiding instability and a parasitic oscillation phenomena.

A further object of the present invention is to provide an amplifier capable of operating on a low supply voltage on the order of about 1.8 volts.

These and other objects, features and advantages in accordance with the present invention are provided by an operational amplifier comprising an input transconductor stage with differential input terminals and one output terminal, an output stage, and at least one intermediate stage connected between the input and output stages so as to from an amplifier chain.

The output stage and each intermediate stage comprises at least one common-emitter bipolar transistor between first and second supply terminals. The bipolar transistor of each stage has a base forming a stage input terminal and a collector forming a stage output terminal. At least one Miller capacitance is connected between the input and the output of at least one intermediate stage. At least one input terminal of each intermediate stage is connected to an output terminal of a previous stage in the amplifier chain, and at least one output terminal of each intermediate stage is connected to an input terminal of a next stage in the amplifier chain.

In accordance with the present invention, at least one intermediate stage comprises at least one feedback resistor connected between the emitter terminal of at least one bipolar transistor of the stage and one of the first and second supply terminals, and at least one feedback capacitance connected between the emitter terminal of the transistor and one output of a next stage.

The first amplifier stage is a transconductor stage capable of delivering at the output thereof a current proportional to a potential difference applied between the two differential inputs. The next stages, i.e., the intermediate stages and the output stage, are gain stages provided for successively amplifying the current delivered by the transconductor stage.

Therefore, rising currents generally pass through the transistors of the successive stages from the input stage to the output terminal of the output stage. The feedback capacitance can be linked to the output of the directly following stage, or, when there are several consecutive following stages, to the output of one of them.

The feedback resistor and capacitance, with which, in accordance with the invention, at least one of the intermediate stages is fitted, allows the pole generated by this stage to be stabilized. In other words, these components allow the frequency deviation of this pole to be limited. Thus, the risk of the pole frequency being greater than that of a following amplifier chain pole or greater than that of a new pole appearing at high frequencies is reduced or removed.

By providing one or several amplifier stages with the feedback resistor or capacitance, in accordance with the present invention, the pole frequencies can be maintained substantially the same as those determined by the transistor quiescent currents. The equation of stability specified in the preceding description is therefore still true for high frequency signals and for high amplifier output currents. Accordingly, the behavior of the amplifier is stable, i.e., oscillation free in spite of high current gain. This feature is particularly advantageous to allow control of high-power equipment powered by a low supply voltage.

The feedback resistor achieves a negative reaction. Its role is essentially to have the transconductance of the transistor fitted therewith tend to a finite value as its collector current increases. The choice of the $R_E$ value of the feedback resistor for a given stage can be determined by the maximum value of the current likely to pass through the transistor of the next stage of the amplifier chain, and, therefore, by the maximum value of the current to be delivered by the amplifier. The choice can also take into account the value of the quiescent current of the transistor fitted with the feedback resistor.

More precisely, the $R_E$ value of the feedback resistor can be chosen so that:

$$R_E I_0 < \frac{kT}{q} \text{ and}$$

$$\frac{R_E I_{max}}{\beta} > \frac{kT}{q}$$

The variable $I_0$ is a quiescent current passing through the transistor of the stage fitted with the feedback resistor, where $I_{max}$ is the maximum current passing through the transistor of the directly following stage of the amplifier chain, and $\beta$ is the minimum gain thereof.

Preferably, $R_E$ can be chosen so that: $R_E I_o$ is smaller compared to $$\frac{kT}{q}$$

and $$R_E \frac{I_{max}}{\beta}$$

is greater compared to $$\frac{kT}{q}.$$

Moreover, the value of the feedback resistor can advantageously be chosen to be low enough to avoid saturation of the transistor of the stage fitted therewith. For this purpose, and more precisely, the value of $R_E$ can advantageously be chosen so that:

$$R_E < \frac{\beta}{I_{max}}(V_{CC} - C_{BE} - V_{sat})$$

In this expression, $V_{CC}$ is the amplifier's minimum supply voltage, $V_{sat}$ is the saturation voltage of the transistor of the stage fitted with the feedback resistor, and $V_{BE}$ the base-emitter voltage of the transistor of the directly following stage of the amplifier chain, to which is linked the transistor fitted with the feedback resistor.

The feedback capacitance, the role of which is explained more in detail in the course of the description, allows better pole stabilization to be obtained despite a relatively low $R_E$ value. It can be composed of one or several capacitors. The possibility of using a feedback resistor with a low $R_E$ value is particularly advantageous when the amplifier is powered with a low $V_{CC}$ voltage. A low supply voltage imposes low $R_E$ values if transistor saturation is to be avoided.

According to an alternative embodiment of the amplifier, the output stage and/or at least one intermediate stage comprises a bipolar transistor, and transistor biasing means series connected with the transistor between the first and second supply terminals for biasing the transistor according to a class A operating mode.

The bipolar transistor of each stage can be a single transistor or a plurality of parallel connected elementary transistors. In the latter case, the base, emitter and collector terminals of each transistor are respectively connected to the base, emitter and collector terminals of the other parallel connected transistors.

According to another amplifier embodiment, the output stage and/or at least one intermediate stage respectively comprises first and second bipolar transistors biased for a class AB operating mode. The first and second transistors each have an emitter, a base and a collector. The transistor emitters are linked respectively to the first and second supply terminals. The transistor bases respectively form the first and second stage inputs, and the transistor collectors respectively form the first and second stage outputs.

Also, each output terminal of an intermediate stage is linked to a single input terminal of a next stage of the amplifier chain. Each input terminal of an intermediate stage is linked to a single output terminal of a previous stage of the amplifier chain.

BRIEF DESCRIPTION OF THE DRAWINGS

Other features and advantages of the invention will be more apparent from the following description, with reference to the appended drawings. This description is given by way of example only and is not to be restrictive.

DETAILED DESCRIPTION OF THE PREFERRED EMBODIMENTS

Figure 1:
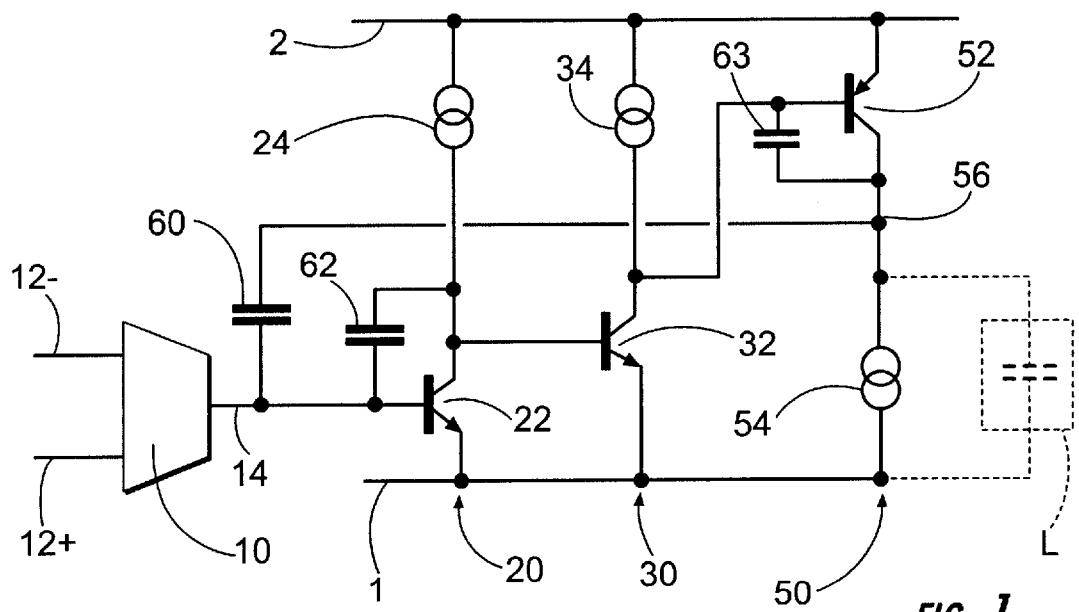
FIG. 1 is a circuit diagram of an operational amplifier according to the prior art.
Figure 2:
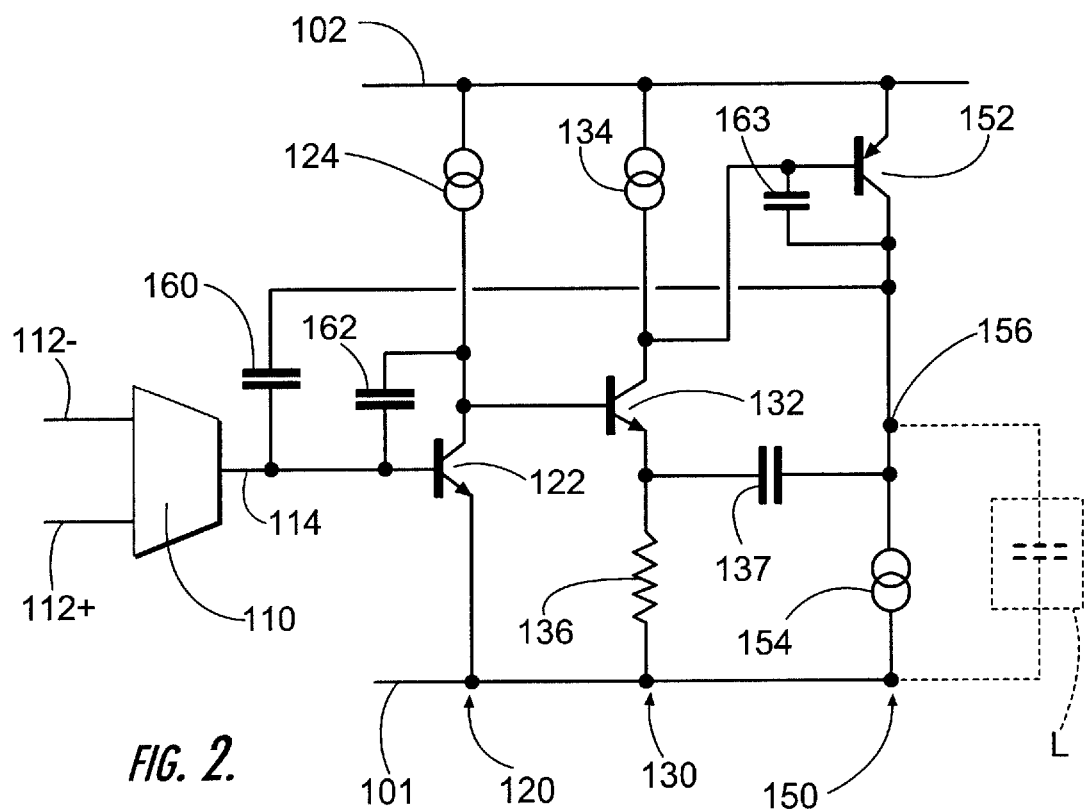
FIG. 2 is a circuit diagram of a first alternative embodiment of an operational amplifier according to the present invention.
Figure 3:
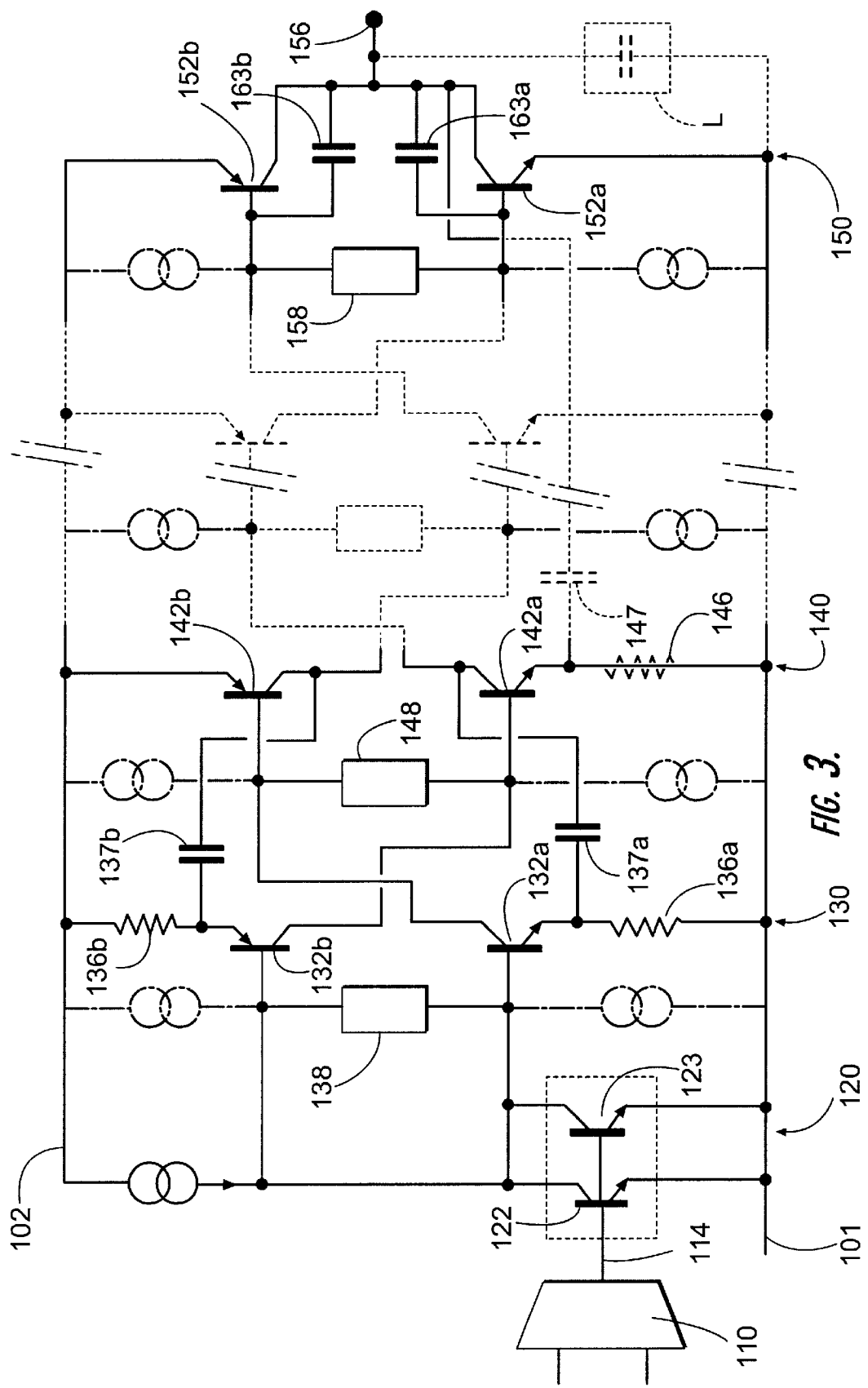
FIG. 3 is a circuit diagram of an alternative embodiment of the operational amplifier according to the present invention.

In FIGS. 2 and 3, a number of elements or components are identical, similar or equivalent to those of FIG. 1, which have already been described. Such elements or components are designated by the same references as those of FIG. 1, with 100 being added thereto.

FIG. 2 shows a first alternative embodiment of an operational amplifier according to the invention, based on common-emitter biased and class A operating transistors. The amplifier of FIG. 2 comprises a transconductor input stage 110 with input terminals 112− and 112+. The amplifier also comprises a gain amplifier chain which, in this order, includes a first intermediate stage 120, a second intermediate stage 130, and an output stage 150.

The gain stages 120, 130, 150 are respectively based on bipolar transistors 122, 132, and 152, which are biased by respective current sources 121, 134, and 154. The amplifier also comprises Miller capacitances 160, 162, and 163 respectively having values of CM, $CM_2$, and $CM_3$. The parts listed above are the same as those already described with reference to FIG. 1 and are connected in the same way. Their detailed description is omitted here, but these parts are described above with reference to FIG. 1.

The bipolar transistors 122, 132, 152 used in the circuit of FIG. 2 have a common emitter. Thus, their base and collector respectively form input and output terminals of gain stages 120, 130, 150. The transistor emitters are respectively connected to one of the supply terminals. In the figure, intermediate stage transistors 122 and 132 are NPN type transistors, and their emitters are linked to a first supply terminal 101 corresponding to a ground terminal. Output stage transistor 152 is a PNP type transistor, and its emitter is linked to a second supply terminal 102 corresponding to a positive potential designated as $V_{CC}$.

The emitter of transistor 132 of the second intermediate stage is linked to the ground terminal 101 via a resistor 136. This resistor, having a value of $R_E$, is a feedback resistor, i.e., a resistor with negative reaction. This resistor is to reduce the pole frequency deviation introduced by the second intermediate stage 130 in the amplifier's gain characteristic.

By referring to the collector current of transistor 132 of the second intermediate stage as $I_2$, the transconductance $gm_2$ of transistor 132 is $$gm_2 = \frac{I_2}{V_T}$$

where $$V_T = \frac{k_T}{q}$$

In this expression, it is noted that $gm_2$ can increase indefinitely with the value of $I_2$, and, therefore, cause considerable deviation of the corresponding pole $p_2$, defined by:

$$P_2 = \frac{CM}{CM_2 \times CM_3} \times gm_2$$

In the presence of feedback resistor 136, a new transconductance Gm can be defined, so that $$Gm = \frac{I_2}{V_T} \times \frac{1}{1 + \frac{I_2}{V_T}R_E},$$

That is, $$Gm = gm \times \frac{1}{1 + gmR_E}$$

By referring to the voltage drop across the terminals of feedback resistor 136 as $V_E$, the following is obtained for collector current $I_2$: $V_E I_2 x R_E$ and $$Gm = gm \times \frac{1}{1 + \frac{V_E}{V_T}}$$

For low values of collector current $I_2$, and in particular, for the quiescent collector current designated as $I_2$, $V_E$ is relatively small compared to $V_T$ and Gm≈gm is obtained. Thus, for small currents causing no instability, the behavior of the stage is the same as that of the corresponding stage of FIG. 1.

On the other hand, for high values of collector current $I_2$, i.e., $I_2 \gg I_2$, voltage $V_E$ is made relatively high compared to $V_T$. Then $$Gm \approx \frac{1}{R_E} =$$

is obtained.

Consequently, stage transconductance Gm for rising collector currents tends to a finite value $$\frac{1}{R_E}$$

independent of the collector current, i.e., independent of the current delivered by the operational amplifier. Indeed, the amplifier's output current is equal to the collector current of a given intermediate stage, times the current gains of the transistors of the next stages.

For high output currents, the pole frequency deviation associated with the second intermediate stage is thus limited to:

$$f_2 = \frac{1}{2\pi} \times \frac{CM}{CM_2 \times CM_3} \times \frac{1}{R_E}.$$

If the values CM, $CM_2$ and $CM_3$ of the Miller capacitances are chosen to satisfy the equation of stability with the value $$Gm = \frac{1}{R_E},$$

the increase in output current causes no instability due to the second intermediate stage.

It is noted that high $R_E$ values allow transconductance Gm to be maintained low. However, it is advantageous to choose $R_E$ low enough so as not to cause saturation of the transistor 132 of the second intermediate stage.

The collector-emitter voltage of transistor 132, referenced as $V_{CE}$, is such that $$V_{CE} = V_{CC} - V_{BE} - \frac{R_E \times I_3}{\beta_3}.$$

In this expression, $V_{BE}$ designates the base-emitter voltage of output stage transistor 152, $I_3$ the collector current, and $\beta_3$ the current gain thereof. Voltage $V_{BE}$ is in the order of 0.75 volts. To avoid saturation of the second intermediate stage transistor 132, $I_3$ and $R_E$ must be set so that $V_{CE} > V_{CEsat}$, where $V_{CEsat}$ is the saturation voltage of the transistor. $V_{CEsat}$ is on the order of 0.15 volt. The $R_E$ value is thus chosen advantageously so that $$R_E < R_{Emax} = \beta \frac{V_{CC} - V_{BE} - V_{CESAT}}{I_3 \max}$$

In this expression, $I_{3max}$ is a maximum value of $I_3$ set by the maximum current to be supplied by the amplifier.

To improve the feedback effect obtained by the resistor, without really increasing the $R_E$ value, i.e., also without limiting the amplifier output current, the circuit comprises a feedback capacitance indicated by reference 137 in FIG. 2. Capacitance 137 is connected between the emitter of second stage transistor 132 and the collector of transistor 152 of output stage 150.

Capacitance 137 allows a feedback current to be injected into transistor 132 of the second intermediate stage when voltage $V_E$ is high compared to $V_T$ (i.e. $V_E \gg V_T$). This is the case when the collector current of the intermediate stage transistor 132 is high compared to the quiescent current. When capacitor 137 has a value of $C_E$, the expression of the pole $p_2$ of the second stage is:

$$P_2 = Gmx \frac{CM}{CM_2 \times (CM_3 + C_E)}$$

This is the same as increasing the value of $CM_3$ of capacitor 163 for high currents, and, therefore, reducing the frequency associated with pole $p_2$. This phenomenon limits an increase of the transconductance gm, and, therefore, also limits the increase of the transconductance Gm taking into account the feedback resistor.

The choice of the $C_E$ value of the feedback capacitor 137 is advantageously guided by that of resistor 136 in as far as an increase in $C_E$ allows a reduction of $R_E$. If $R_{Emax}$ designates a maximum value of $R_E$ chosen to avoid transistor saturation, the following relation is true:

$$C_E = \frac{R_E}{E_{Emax}} \times CM_3$$

By way of example, if $C_E = 10 \times CM_3$, an $R_E$ value as low as $$\frac{R_{Emax}}{10}$$

can be used. This makes it possible to set the value more freely as a function of other parameters. As discussed before, particularly good results are obtained when $R_E$ is chosen so that:

$R_E I_{O2}$ is small compared to kT/q, and $$\frac{R_E I_3 \max}{\beta_3}$$

is large compared to kT/q.

In this expression, $I_{3max}$ designates the maximum collector current of the output stage. In other words, the voltage across the terminals of the feedback resistor 136, when a quiescent current is passing therethrough, is low compared to $V_T$ and the maximum voltage $$V_{Emax} = \frac{R_E I_3 \max}{\beta_3}$$

is high compared to $V_T$ when the amplifier delivers a maximum current.

FIG. 3, described hereafter, shows another alternative embodiment of an operational amplifier according to the present invention. The amplifier comprises an input stage 110, a number of intermediate stages 120, 130, 140, and an output stage 150.

The first intermediate stage 120 is comparable to the first stage of FIG. 2. It comprises two bipolar transistors 122 and 123 parallel connected and biased by a current source 124. The stage input is formed by the bases of transistors 122 and 123, which are linked to the output 114 of transconductor stage 110. The output of the first intermediate stage is formed by the collectors of transistors 122 and 123, which are linked together.

The intermediate stages following the first intermediate stage and the output stage are each based on two bipolar transistors operating in class AB mode. A first bipolar transistor 132a, 142a, 152a of the stages is an NPN type transistor, and the emitter thereof is respectively linked to the first supply terminal 101. This first transistor of each stage is respectively associated with a second transistor 132b, 142b, 152b. The second transistor is a PNP type transistor, the emitter of which is respectively linked to the second supply terminal.

The collector of the first and second transistors of each intermediate stage is linked to the respective bases of the second and first transistors of the next stage. By way of example, the collector of the second transistor 132b of the third stage 130 is linked to the base of the first transistor 142a of the fourth stage 140. In the same way, the collector of the first transistor 132a of the third stage 130 is linked to the base of the second transistor 142b of the fourth stage 140.

The bases of the first and second transistors of the gain stages are biased and driven by biasing circuits 138, 148, 158. These circuits are usually called class AB control circuits and are biased by the current sources represented as a dotted line.

A more detailed description of the class AB control type circuits is provided, for instance, in reference to the following two documents: (1) "Parallel Feedforward Class-AB Control Circuits for Low-Voltage Bipolar Rail-to-Rail Output Stages of Operational Amplifiers," by Renirie et al., Analog Integrated Circuits and Signal Processing, 8.37–48 (1995); and (2) "A Compact Power-Efficient 3 V CMOS Rail-to-Rail Input/Output Operational Amplifier for VLSI Cell Libraries," by Hogervorst et al., IEEE JOURNAL OF SOLID-STATE CIRCUITS, vol. 29, no. 12, December 1994.

In FIG. 3, references 163a and 163b designate Miller capacitances respectively connected between the bases and the collectors of output stage transistors 152a and 152b. The amplifier output terminal 156 is formed by the collectors of these transistors, which are linked together.

The circuit of FIG. 3 can comprise further Miller capacitances corresponding, e.g., to capacitances 160 and 162 of FIG. 2. These capacitances may be connected, e.g., between the base of the transistors 122 and 123 of the first stage 110 and their collector, or between the base and the amplifier output terminal 156. These capacitances are omitted from the figure to simplify illustration of the circuit.

In the sample embodiment described, and in accordance with the invention, the emitter of the first transistor 132a of the second intermediate stage 130 is linked to the first supply terminal 101 via a first feedback resistor 136a. In the same way, the emitter of the second transistor 132b of the same stage is linked to the second supply terminal 102 via a second feedback resistor 136b.

The emitters of the first and second transistors 132a and 132b are linked to the outputs of a next stage, in this case, to the outputs of the third intermediate stage 140 through respective feedback capacitances 137a and 137b. More precisely, a first feedback capacitance 137a is connected between the emitter of the first transistor 132a of the second intermediate stage 130 and the collector of the first transistor 142a of the third intermediate stage 140. In the same way, a second capacitance 137b is linking the emitter of the second transistor 132b of the second stage 130 to the collector of the second transistor 142b of the third stage 140.

According to other possibilities, capacitances 137a and 137b can also be connected between the emitters of the transistors of the second stage 130 and the collectors, i.e., the outputs of a next stage in the chain, or even to output terminal 156.

FIG. 3 also shows as a dotted line a feedback resistor 146 and a feedback capacitance 147, which may be fitted to another intermediate stage, such as to the third stage 140, for example. In this example, the capacitor 147 links the emitter of the first transistor 142a of the third stage 140 to the output terminal 156.

Furthermore, it should be noted that in a simplified version, a feedback resistor and capacitance may be connected to only one of the intermediate stage transistors.

That which is claimed is:

1. An operational amplifier comprising:
    an input transconductor stage with differential inputs and an output;
    an output stage;
    at least one intermediate stage connected between said input stage and said output stage and defining an amplifier chain therewith;
    said output stage and each intermediate stage comprising
        at least one common-emitter bipolar transistor connected between first and second power supply terminals, the bipolar transistor of a respective stage comprising a base defining an input and a collector defining an output;
    at least one capacitance connected between the input and the output of said at least one intermediate stage; and
    said at least one intermediate stage comprising
        at least one feedback resistor connected between an emitter of the at least one bipolar transistor and one of the first and second power supply terminals, and
        at least one feedback capacitance connected between the emitter of the at least one bipolar transistor and the output of a next stage.

2. An operational amplifier according to claim 1, wherein the input of each intermediate stage is connected to an output of a previous stage in the amplifier chain, and the output of each intermediate stage is connected to an input of a next stage in the amplifier chain.

3. An operational amplifier according to claim 1, wherein said at least one capacitance defines a Miller capacitor.

4. An operational amplifier according to claim 1, wherein at least one of said output stage and said at least one intermediate stage comprises a biasing circuit series connected with a respective bipolar transistor between the first and second power supply terminals for biasing the bipolar transistor according to a class A operating mode.

5. An operational amplifier according to claim 1, wherein the at least one bipolar transistor comprises a plurality of parallel connected bipolar transistors.

6. An operational amplifier according to claim 1, wherein the at least one bipolar transistor comprises a first and a second bipolar transistor biased for class AB operation for at least one of said output stage and said at least one intermediate stage; and said first and second transistors each comprising an emitter respectively connected to the first and second power supply terminals, a base respectively defining first and second inputs, and a collector respectively defining first and second outputs.

7. An operational amplifier according to claim 6, wherein the first and second outputs of an intermediate stage are respectively connected to first and second inputs of a next stage of the amplifier chain, and the first and second inputs of the intermediate stage are respectively connected to first and second outputs of a previous stage of the amplifier chain.

8. An operational amplifier according to claim 6, wherein the first output of a respective intermediate stage is connected to an input of a next stage of the amplifier chain with the emitter of the next stage being connected to the second power supply terminal, and the emitter of the respective intermediate stage is connected to the first power supply terminal.

9. An operational amplifier according to claim 6, wherein the second output of a respective intermediate stage is connected to an input of a next stage of the amplifier chain with the emitter of the next stage being connected to the first power supply terminal, and the emitter of the respective intermediate stage is connected to the second power supply terminal.

10. An operational amplifier according to claim 1, wherein a value $R_E$ of said at least one feedback resistor is chosen so that:

$$R_E I_0 < \frac{kT}{q}, \text{ and } R_E \frac{I_{max}}{\beta} > \frac{kT}{q}$$

where $I_0$ is a quiescent current passing through the at least one bipolar transistor of said at least one intermediate stage that includes said feedback resistor connected thereto, where $I_{max}$ is a maximum current conducting through the at least one transistor of a next stage of the amplifier chain, and $\beta$ is a minimum gain thereof.

11. An operational amplifier comprising:
an input stage with differential inputs and an output;
an output stage;
at least one intermediate stage connected between said input stage and said output stage and defining an amplifier chain therewith;
at least one of said output stage and said at least one intermediate stage comprising first and second common-emitter bipolar transistors connected between first and second power supply terminals, said first and second transistors each comprising an emitter respectively connected to the first and second power supply terminals, a base respectively defining first and second inputs, and a collector respectively defining first and second outputs;
a first and a second capacitance connected between the respective first and second inputs and the first and second outputs of said at least one intermediate stage; and
said at least one intermediate stage comprising
a first feedback resistor connected between the emitter of the first bipolar transistor of a respective stage and the first power supply terminal, and a second feedback resistor connected between the emitter of the second bipolar transistor of the respective stage and the second power supply terminal, and
a first feedback capacitance connected between the emitter of the first bipolar transistor and the first output of a next stage, and a second feedback capacitance connected between the emitter of the second bipolar transistor and the second output of the next stage.

12. An operational amplifier according to claim 11, wherein said at least one intermediate stage comprises a first intermediate stage and a plurality of other intermediate stages connected therewith to define the amplifier chain; and wherein first and second inputs of each other intermediate stage are respectively connected to first and second outputs of a previous stage in the amplifier chain, and first and second outputs of each other intermediate stage are connected to respective first and second inputs of a next stage in the amplifier chain.

13. An operational amplifier according to claim 11, wherein said first and second capacitances each defines a Miller capacitor.

14. An operational amplifier according to claim 11, wherein at least one of said output stage and said at least one intermediate stage comprises a biasing circuit series connected with a respective bipolar transistor between the first and second power supply terminals for biasing the bipolar transistor according to a class A operating mode.

15. An operational amplifier according to claim 11, wherein the first and second bipolar transistors are parallel connected between the first and second power supply terminals.

16. An operational amplifier according to claim 11, wherein the first output of an intermediate stage is connected to the second input of a next stage of the amplifier chain with the emitter of the next stage being connected to the second power supply terminal, and the first emitter of the intermediate stage is connected to the first power supply terminal.

17. An operational amplifier according to claim 11, wherein the second output of an intermediate stage is connected to the first input of a next stage of the amplifier chain with the first emitter of the next stage being connected to the first power supply terminal, and the second emitter of the intermediate stage is connected to the second power supply terminal.

18. An operational amplifier according to claim 11, wherein a value $R_E$ of said first and second feedback resistors are chosen so that:

$$R_E I_0 < \frac{kT}{q} \text{ and } R_E \frac{I_{max}}{\beta} > \frac{kT}{q}$$

where $I_0$ is a quiescent current passing through one of the first and second bipolar transistors of the intermediate stage that includes said first and second feedback resistors connected thereto, where $I^{max}$ is a maximum current conducting through one of the first and second transistors of a next stage of the amplifier chain, and $\beta$ is a respective minimum gain thereof.

19. A method for increasing stability of an operational amplifier comprising an input stage, an output stage, and a plurality of intermediate stages connected between the input stage and the output stage and defining an amplifier chain therewith, the output stage and each intermediate stage comprising at least one common-emitter bipolar transistor between first and second power supply terminals, the bipolar transistor of each respective stage comprising a base defining an input and a collector defining an output, and at least one capacitance connected between the input and the output of the at least one intermediate stage, the method comprising:

reducing output current of a bipolar transistor in the amplifier chain using a feedback resistor connected between an emitter of the bipolar transistor and one of the first and second power supply terminals; and
maintaining a feedback obtained by the feedback resistor using a feedback capacitance connected between the emitter of the bipolar transistor and the output of a next stage.

20. A method according to claim 19, wherein the input of each intermediate stage is connected to an output of a previous stage in the amplifier chain, and the output of each intermediate stage is connected to an input of a next stage in the amplifier chain.

21. A method according to claim 19, wherein the at least one capacitance defines a Miller capacitor.

22. A method according to claim 19, further comprising biasing a respective bipolar transistor of at least one of the output stage and the at least one intermediate stage according to a class A operating mode.

23. A method according to claim 19, wherein the at least one bipolar transistor comprises a plurality of parallel con nected bipolar transistors for at least one of the output stage and the at least one intermediate stage.

24. A method according to claim 19, wherein the at least one bipolar transistor comprises a first and a second bipolar transistor biased for class AB operation for at least one of the output stage and the at least one intermediate stage; and the first and second transistors each comprising an emitter respectively connected to the first and second power supply terminals, a base respectively forming first and second inputs, and a collector respectively forming first and second outputs.

25. A method according to claim 19, wherein a value $R_E$ of the at least one feedback resistor is chosen so that:

$$R_E I_0 < \frac{kT}{q} \text{ and } R_E \frac{I_{max}}{\beta} > \frac{kT}{q}$$

where $I_0$ is a quiescent current passing through the at least one bipolar transistor of the at least one intermediate stage that includes the feedback resistor connected thereto, where $I_{max}$ is a maximum current conducting through the at least one transistor of a next stage of the amplifier chain, and b is a minimum gain thereof.

* * * * *